(12) United States Patent
Sakamoto

(10) Patent No.: US 6,747,315 B1
(45) Date of Patent: Jun. 8, 2004

(54) SEMICONDUCTOR DEVICE HAVING MOS FIELD-EFFECT TRANSISTOR

(75) Inventor: Kazuhisa Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/030,089

(22) PCT Filed: Jul. 13, 2000

(86) PCT No.: PCT/JP00/04715

§ 371 (c)(1),
(2), (4) Date: Jan. 14, 2002

(87) PCT Pub. No.: WO01/06569

PCT Pub. Date: Jan. 25, 2001

(30) Foreign Application Priority Data

Jul. 15, 1999 (JP) .......................................... 11/201875

(51) Int. Cl.[7] .......................... H01L 29/76; H01L 29/94; H01L 31/062; H01L 31/113; H01L 31/119
(52) U.S. Cl. ......................................... 257/341; 257/401
(58) Field of Search ................................. 257/328, 341, 257/401, 329

(56) References Cited

U.S. PATENT DOCUMENTS 6,462,378 B1 * 10/2002 Kim ........................... 257/342

2003/0067033 A1 * 4/2003 Kinoshita et al. ........... 257/328

FOREIGN PATENT DOCUMENTS

EP    0 416 805 A2 * 3/1991

* cited by examiner

*Primary Examiner*—Phat X. Cao
(74) *Attorney, Agent, or Firm*—Arent Fox PLLC

(57) ABSTRACT

P-wells (21) are formed in, for example, a matrix in an N-type semiconductor layer (20). At an outer periphery of each of the P-wells (21) is formed, for example, a rectangular ring-shaped N$^+$-type diffused source region (22), between which and an N-type semiconductor layer (20) which provides a drain region (23) is formed a channel region (26). A source electrode (33) is formed in such a manner as to be contact with the center portion of each of the P-wells (21) and the source region (22) in such a construction that a contact portion (40) of the P-well with the source electrode consists of P$^+$-type regions and N$^+$-type regions formed alternately. As a result, it is possible to rapidly eliminate the minority carrier generated in the P-well owing to a counter electromotive force etc., thus speeding the switching operations.

6 Claims, 3 Drawing Sheets

US 6,747,315 B1

SEMICONDUCTOR DEVICE HAVING MOS FIELD-EFFECT TRANSISTOR

This application is a 371 of PCT/JP00/04715, filed Jul. 13, 2000.

FIELD OF THE INVENTION

The present invention relates to a semiconductor device having a MOS field-effect transistor (hereinafter abbreviated as MOSFET) such as a vertical-type power MOSFET or a double diffusion-type MOSFET. More particularly, the present invention relates to such a MOSFET that has a very short turn-ON/OFF time and an improved reverse withstanding voltage.

BACKGROUND ART

A driver circuit is frequently used which employs a vertical-type or double diffusion-type power MOSFET to drive an inductive load such as a motor. For example, the vertical-type power MOSFET has such a configuration, as shown in FIG. 4, that a P-well 21 is formed on the surface of an N-type semiconductor layer 20 provided on a N$^+$-type semiconductor substrate 20$a$, and at an outer periphery of this P-well 21 is formed a ring-shaped N$^+$-type source diffusion layer 22. In this configuration, the semiconductor layer 20 outside the P-well 21 and the semiconductor substrate 20$a$ act as a drain layer 23.

The surface region of the P-well 21 between the drain layer 23 and the source layer 22 acts as a channel region 26, on which is provided a gate electrode 28 with a gate insulator film 27 interposed therebetween. At the center of the P-well 21 is provided a P$^+$-type region 25 for ohmic-contact such that a source electrode 33 may be connected to this P$^+$-type region 25 and the source region 22. The drain electrode 24 is provided on the back surface of the semiconductor substrate 20$a$. Thus, the vertical-type MOSFET is formed.

A PN junction of the P-well 21 and the N-type semiconductor layer 20 forms a so-called built-in diode (body diode). This built-in diode is structured so as to be connected in the reverse direction between the drain and the source and can be used as a flywheel diode for inducing a reverse recovery current ascribed to a counter electromotive force of an inductive load.

The counter electromotive force of the inductive load acts to apply a voltage in the forward direction on the built-in diode, which is accompanied, as well known, by accumulation of minority carrier, that is, electrons in the P-well. Thus accumulated minority carrier inhibits rapid interruption of the operation of the built-in diode at the time of rectification when the current is changed in flow direction. Moreover, if the flow of this minority carrier is concentrated to part of the device, the PN junction portion of the P-well and the drain layer is broken and hence the power MOSFET is broken eventually.

In view of the above, it is an object of the invention to provide a semiconductor device including a MOSFET that can solve these technological problems in providing high-speed switching operations of a built-in diode and improving the breakdown resistance amount (withstanding voltage).

DISCLOSURE OF THE INVENTION

A semiconductor device including a MOS field-effect transistor according to the present invention includes; a MOS field-effect transistor; and a diode which is built in the transistor and connected between a source electrode and a drain electrode thereof so that when a voltage in the reverse direction is applied between the source electrode and the drain electrode at the time of operation, which forms a current path between the source electrode and the drain electrode, wherein a contact portion of the diode with the source electrode has such a construction that a high-impurity concentration region having a second conductivity type which is a conductivity type of the source electrode side semiconductor layer of the diode, and a region having a first conductivity type opposite to the conductivity type or a low-impurity concentration region having the second conductivity type are formed alternately in a plan structure.

The "high-impurity concentration" of the high-impurity concentration region of the second conductivity type means such an impurity concentration as to form an ohmic contact with the source electrode.

By this construction, if a counter electromotive force is generated when an inductive load such as a motor connected to a circuit having a device of the present invention is turned OFF, a resultant voltage in the reverse direction applied between the drain and the source is cancelled by the built-in diode, after which the minority carrier remaining in the second conductivity type region is dropped into the first conductivity type region of the contact portion, thus enabling suppressing the accumulation of the minority carrier in the second conductivity type region. This mechanism enables rapidly not to make a working of the built-in diode. Also, since the minority carrier is not accumulated, a large current is not concentrated to part of the device at the time of rectification, thus enabling enhancing the withstanding voltage.

Specifically, this effect is remarkable especially when the MOS field-effect transistor is a double-diffusion type MOS field-effect transistor that has a first conductivity type semiconductor layer which provides a drain region, second conductivity type regions which are formed by diffusion in the first conductivity type semiconductor layer, and source regions having a first conductivity type formed by diffusion at an outer periphery of each of the second conductivity type regions in such a configuration that such portions of the second conductivity type regions which are positioned between each of the source regions and the drain region act as channel regions.

More specifically, the source electrode is provided so as to be in contact with each of the source regions and a surface portion of each of the second conductivity type regions opposite to each of the channel regions with respect to each of the source regions. Further, the second conductivity type regions are formed in a matrix in the first conductivity type semiconductor layer, each of the source regions is formed in a ring shape on a plan view in each of the second conductivity type regions so as to give a constant gap at the periphery of each of the second conductivity type regions, and also the source electrode is formed at a predetermined region of an inner circumference of each of the ring-shaped source regions and the entire inner surface of each of the second conductivity type regions, thus providing a mass-capacity power MOSFET.

Specifically, the contact portion has such a construction that a contact portion of each of the second conductivity type regions with the source electrode has such a construction that one or more first conductivity type high impurity-concentration regions each of which is ring shape on a plan view and one or more second conductivity type high impurity-concentration regions are provided alternately or that the second conductivity type regions have a low impurity concentration; and wherein a contact portion of each of the second conductivity type regions with the source electrode has such a construction that second conductivity type high impurity-concentration regions are evenly spaced in each of the second conductivity type regions.

BEST MODE FOR CARRYING OUT THE INVENTION

Figure 1:
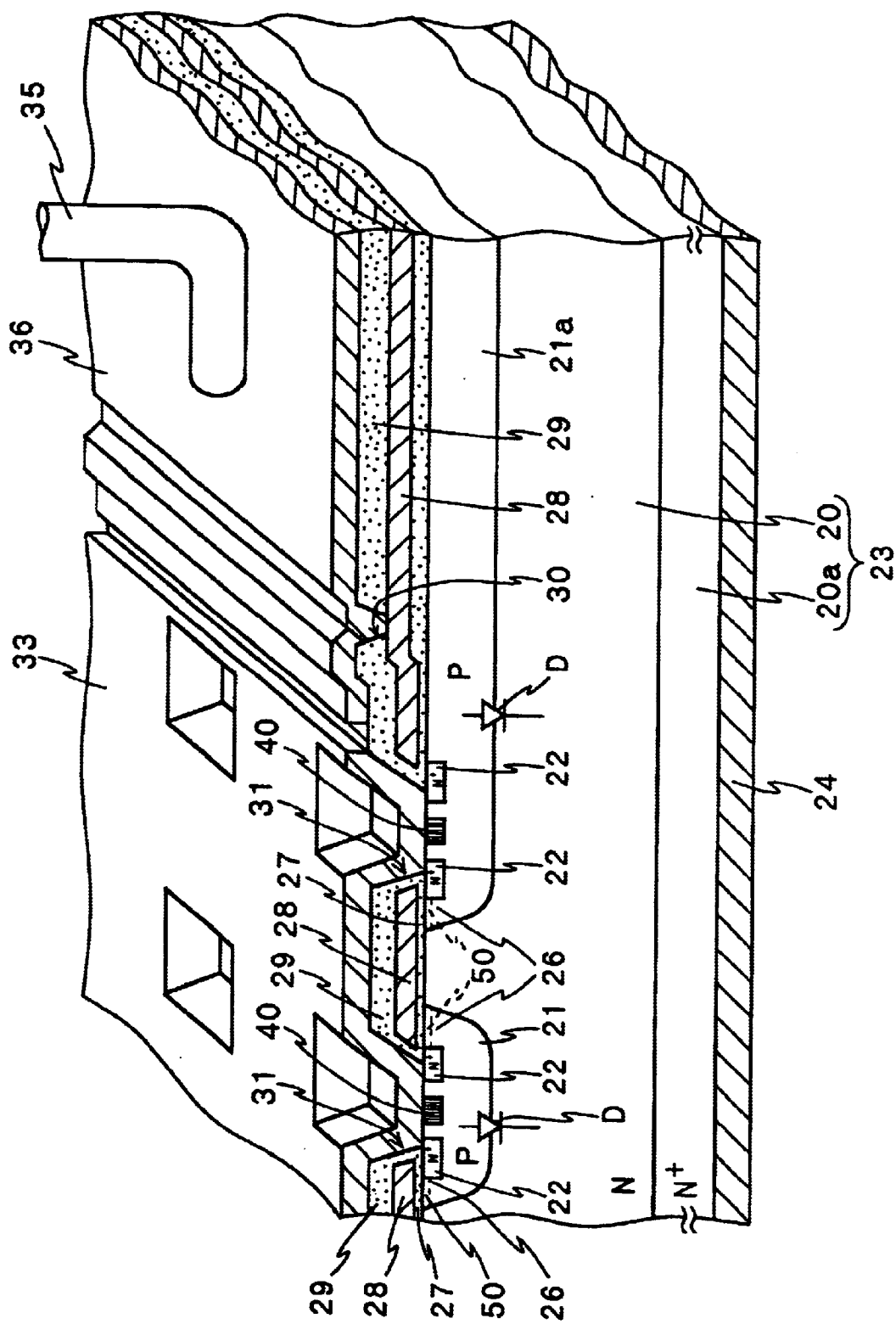
FIG. 1 is an expanded perspective and partial cross-sectional view for showing a construction of a MOSFET according to one embodiment of the present invention.

The following will describe a semiconductor device having a MOSFET according to the present invention with reference to the drawings. As can be seen from its cross-sectional view of one embodiment shown in FIG. 1, in a semiconductor device having a MOSFET of the present invention, in a surface of the N-type semiconductor layer 20 is formed a predetermined pattern of a P-wells 21 by diffusion. For example, directly below a gate pad 36 to which a gate terminal 35 is connected, a large-area P-well 21a (P-well below the pad) is formed, and in the remaining region is formed an evenly spaced plurality of the P-wells 21 in a matrix pattern, and each of P-wells 21 is, for example, rectangular in a plan view.

At the outer periphery of each of the P-wells 21 is formed, for example, a rectangular ring-shaped N$^+$-type diffused source region 22. The semiconductor layer 20 except this P-well 21 and an N$^+$-type semiconductor substrate 20a on which this semiconductor layer 20 is grown act as a drain region 23, thus providing a vertical-type double-diffusion MOSFET. On the back side surface of the N$^+$-type semiconductor substrate 20a is provided a drain electrode 24.

In the P-well 21, a surface layer portion positioned between the drain region 23 and the diffused source region 22 provides a channel region 26 in which is formed a channel 50 when the MOSFET is turned ON. Above this channel region 26 is formed a gate electrode 28 with a gate insulator film 27 interposed therebetween. The gate electrode 28 directly below the gate pad 36 is connected to the gate pad 36 through a contact hole 30 formed in the insulator film 29 on the gate electrode 28. The other gate electrodes 28 are connected to the gate electrodes 28 directly below the gate pad 36 at a position not shown in the figure.

In the insulator film 29 are formed, on the surface of each P-well 21, a source contact hole 31 for exposing the diffused source region 22 provided in this P-well 21 and the surface of the P-well 21 surrounded by this diffused source region 22. A source electrode 33 formed on the insulator film 29 is commonly connected through this source contact holes 31 to all of the diffused source region 22 provided on the surface of each P-well 21 and the surfaces of portions surrounded by the diffused source region 22 in each P-well 21.

This results in such a construction that between the source electrode 33 and the drain electrode 24 is connected a diode consisting of a PN junction of the P-well 21 and the N-type semiconductor layer 20 (drain region), which diode acts as a built-in diode D that becomes conductive when a voltage in the reverse direction to that applied when this MOSFET is operated is applied across itself. That is, this built-in diode D may be used as a flywheel diode for flowing therethrough a reverse recovery current ascribed to a reverse electromotive force of an inductive load such as a motor when this MOSFET is used to drive it.

The invention features that a contact portion 40 of the p-well 21 with the source electrode 33 is not formed of a contact region only of a p$^+$-type region but is formed in such a configuration that a P$^+$-type region and an N$^+$-type region alternate with each other in a plan view.

Figure 2A:
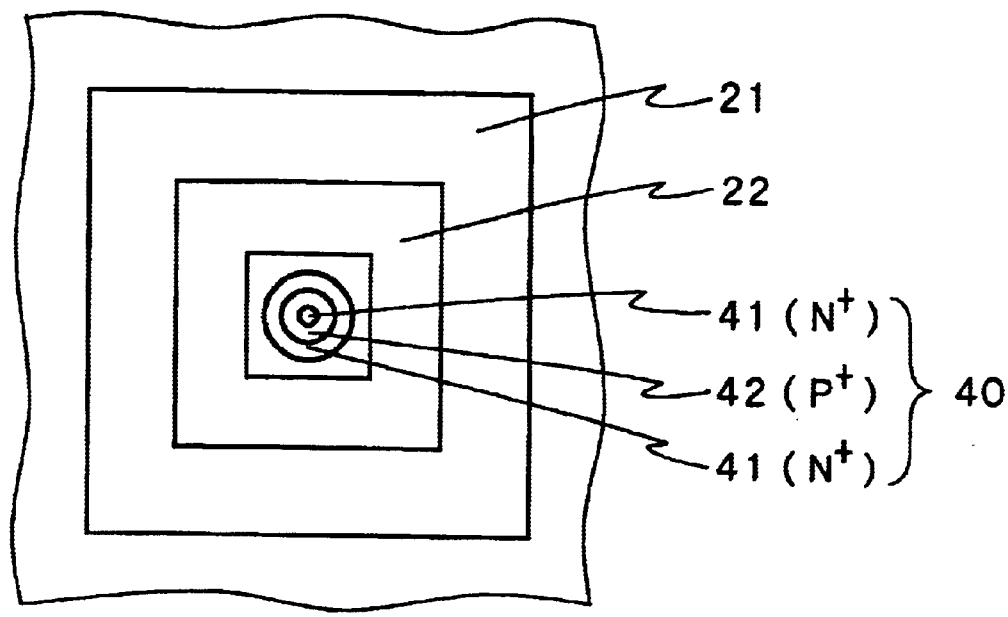
FIGS. 2A and 2B are a plan view and a cross-sectional view respectively, for showing a construction of a contact portion with a source electrode which is removed.
Figure 2B:
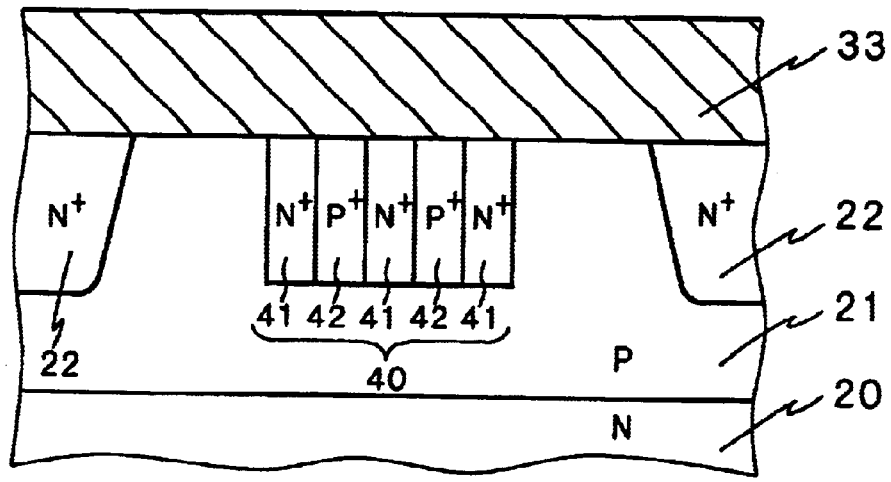

That is, as shown in FIG. 2A illustrating a plan view of the contact portion 40 with the source electrode 33 etc. as removed and FIG. 2B illustrating an expanded cross-sectional view of part of FIG. 2A, in the outer surface layer of such a region of the P-well 21 that is surrounded by the rectangular ring-shaped diffused source region 22 are formed concentrically a small-width N$^+$-type (or N-type) ring-shaped region 41 and an equivalently small-width P$^+$-type ring-shaped region 42 alternately. These regions 41 and 42 make up the contact portion 40 and all come in contact with the source electrode 33 in an ohmic manner. That is, the N$^+$-type region 41 and the P$^+$-type region 42 are arrayed alternately in a plan view.

In such a configuration, electrons, if any as a minority carrier in the P-well 21, fall in the N$^+$-type region 41 and then can be drawn out to the source electrode 33 rapidly. Thus, it is possible to suppress the accumulation of electrons in the P-well 21.

When the MOSFET according to this embodiment is used to drive an inductive load such as a motor, a turn-ON voltage is applied at the gate electrode 28 to form a channel 50 (see FIG. 1) to thereby interconnect the source region 22 and the drain region 23 therethrough. When the MOSFET is ON, it turns out as a voltage in the reverse direction is applied on the built-in diode D, which results in as the built-in diode D presents no actions.

When a turn-OFF voltage is applied at the gate to give a non-conductive state between the source and drain regions, a reverse electromotive force is applied from the inductive load to apply a voltage in the forward direction to the built-in diode D, through which in turn a reverse recovery current flows, thus canceling the reverse electromotive force. In this case, a minority carrier (electrons in an example shown in FIG. 1), if left in the P-well 21, may retard the operations of the transistor when a turn-ON voltage is applied on its gate and so needs to disappear rapidly. For this purpose, by the invention, the contact portion of the diode D with the source electrode has such a construction that the N$^+$-type and P$^+$-type regions alternate with each other in the P-well, so that the minority-carrier electrons can fall into the N$^+$-type region and then be drawn out to the source electrode.

Thus, a current can flow immediately when the MOSFET is turned ON, so that at the time of commutation (when such a situation occurs that a voltage in the reverse direction is applied to the built-in diode), the built-in diode D can be immediately blocked (turned OFF), thus shortening the reverse recovery time ($t_{rr}$) significantly. Besides, no electrons are accumulated in the P-well 21, so that no large current is concentrated during commutation nor is destroyed the PN junction of the built-in diode D. These features enable manufacturing such a MOSFET that has significantly improved breakdown resistance amount as compared to that of the prior art construction.

Specifically, the reverse recovery time $t_{rr}$ of the built-in diode D could be shortened by about 30% and the avalanche current (largest current that does not destroy the PN junction) of the built-in diode D could be increased by about 20%.

Figure 3:
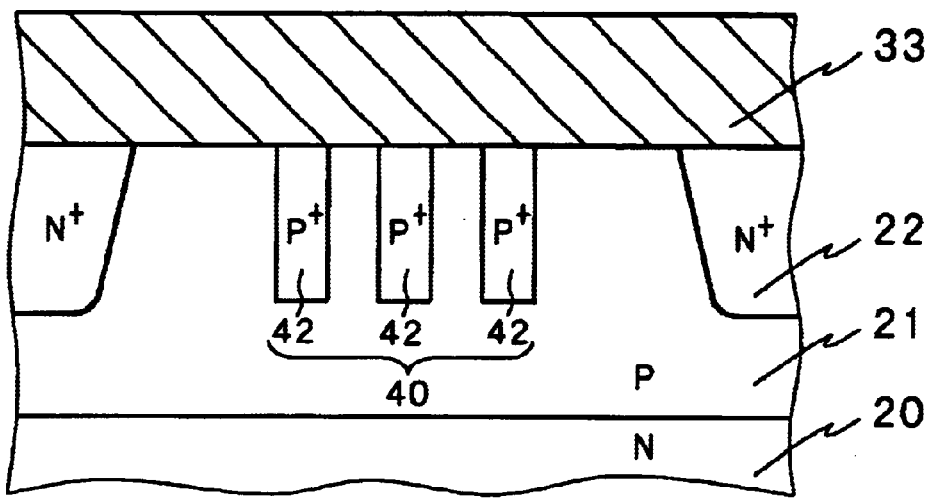
FIG. 3 is a cross-sectional view for showing another example of the construction of the contact portion.
Figure 4:
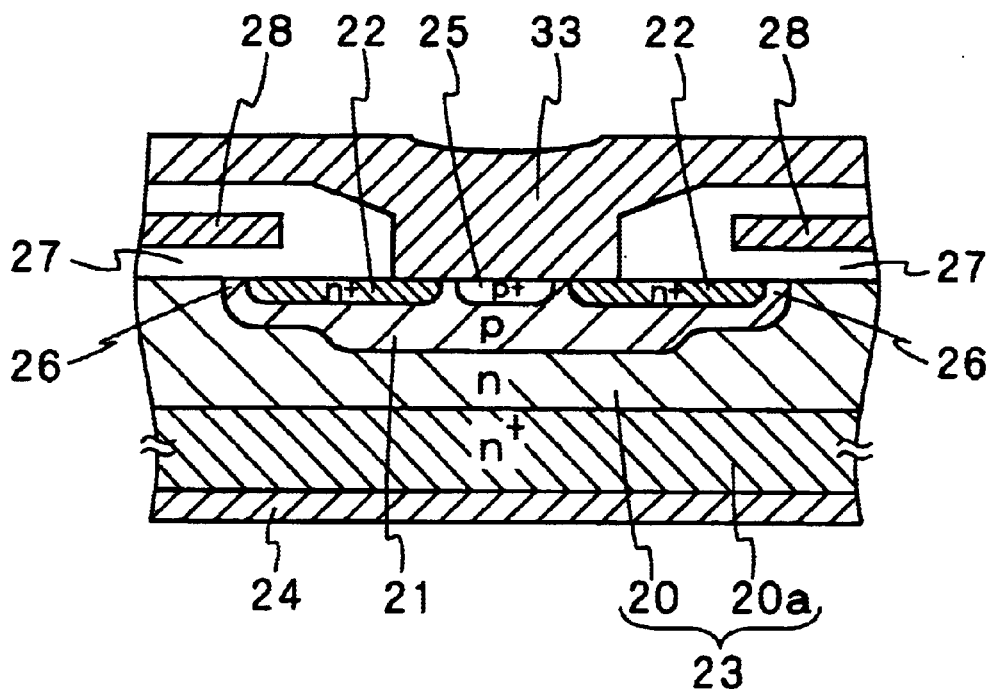
FIG. 4 is a cross-sectional view for showing an example of a construction of a prior art vertical-type MOSFET.

FIG. 3 is a cross-sectional view for showing another configuration example of the contact portion 40 between the P-well and the source electrode 33. In FIG. 3, the same elements as those in FIGS. 1, 2A and 2B are indicated by the same reference numerals. In this example, the contact portion 40 is comprised of a plurality of evenly spaced P$^+$-type regions 42. Therefore, in the construction shown by the cross-sectional view of FIG. 3 or a construction of a plan view not shown (similar to FIG. 2A), the P$^+$-type region 42 and the P-well 21 region are formed alternately. This P-well 21 has a low impurity concentration and has a Schottky junction formed between itself and the source electrode 33.

In this construction, the minority-carrier electrons in the P-well 21 are rapidly released through the Schottky junction portion with the source electrode 33. That is, the Schottky portion has the same actions as those by the N$^+$-type region shown in FIGS. 2A and 2B to thereby rapidly remove the minority-carrier electrons, thus achieving the same effects as those mentioned above.

The N$^+$-type region 41 may be an N-type region as far as an ohmic contact can be obtained with the source electrode 33 in terms of impurity concentration and also, the contact portion 40 of the P-well 21 with the source electrode 33 having a configuration that one pair of a P$^+$-type region and an N$^+$-type (or N-type) region or P-type region are formed functions as a minority-carrier take-in structure of the invention.

Although one embodiment of the invention has been described, the invention is applicable also to other embodiments. For example, although the above-mentioned embodiment has employed a vertical-type double-diffusion MOSFET, the present invention is applicable also to a horizontal-type double-diffusion MOSFET and not limited to double-diffusion MOSFET even also to a CMOSFET with the same construction. Further, although an N-channel type MOSFET has been exemplified, the invention is applicable also to a P-channel type MOSPET. In this case, for example, an N+region and a P$^+$ region may be arrayed alternately in an N-well or a plurality of N$^-$ regions is evenly spaced to provide a Schottky junction portion. In the Schottky junction portion in such a case, some of the electrode materials for the source electrode 33 may be made of Titanium (Ti) or Molybdenum (Mo) in place of Aluminum (Al).

Also, the impurity-diffused regions which make up the contact portion need not be formed concentrically but may be formed in a straight stripe or any other appropriate shape. For example, when the P-well is formed in a stripe shape and source regions are also formed in a stripe shape therein, preferably the contact portion is formed in a stripe shape correspondingly.

Further, although the above-mentioned embodiment has exemplified such a semiconductor device that has one MOSFET, the invention is applicable also to such a semiconductor device that has a plurality of MOSFETs or that a functional element other than a MOSFET on the same semiconductor substrate.

INDUSTRIAL APPLICATION

By the present invention, it is possible to obtain a MOSFET which has a fast switching speed and a high breakdown resistance amount (withstanding voltage) and effectively use it in, for example, a power source IC, a motor driver, or a solenoid drive in a DVD apparatus, a portable audio apparatus, a switching power source, and the like.

What is claimed is:

1. A semiconductor device comprising:
   a MOS field-effect transistor; and
   a diode which is built in said transistor and connected between a source electrode and a drain electrode thereof so that when a voltage in the reverse direction is applied between said source electrode and said drain electrode at the time of operation which forms a current path between said source electrode and drain electrode,
   wherein a contact portion of said diode with said source electrode has such a construction that a high-impurity concentration region having a second conductivity type which is a conductivity type of said source electrode side semiconductor layer of said diode, and a region having a first conductivity type opposite to said second conductivity type or a low-impurity concentration region having said second conductivity type are formed alternately in a plan structure.

2. The semiconductor device of claim 1, wherein said MOS field-effect transistor is a double-diffusion type MOS field-effect transistor that has a first conductivity type semiconductor layer which provides a drain region, second conductivity type regions which are formed by diffusion in said first conductivity type semiconductor layer, and source regions having a first conductivity type formed by diffusion at an outer periphery of each of said second conductivity type regions in such a configuration that such portions of said second conductivity type regions which are positioned between each of said source regions and said drain region act as channel regions.

3. The semiconductor device of claim 2, wherein said source electrode is provided so as to be in contact with each of said source regions and a surface portion of each of said second conductivity type regions opposite to each of said channel regions with respect to each of said source regions.

4. The semiconductor device of claim 3, wherein said second conductivity type regions are formed in a matrix in said first conductivity type semiconductor layer, each of said source regions is formed in a ring shape on a plan view in each of said second conductivity type regions so as to give a constant gap at the periphery of each of said second conductivity type regions, and also said source electrode is formed at a predetermined region of an inner circumference of each of said ring-shaped source regions and the entire inner surface of each of said second conductivity type regions.

5. The semiconductor device of claim 4, wherein a contact portion of each of said second conductivity type regions with said source electrode has such a construction that one or more first conductivity type high impurity-concentration regions, each of which is ring shape on a plan view and one or more second conductivity type high impurity-concentration regions are provided alternately.

6. The semiconductor device of claim 4, wherein each of said second conductivity type regions has a low impurity concentration; and wherein a contact portion of each of said second conductivity type regions with said source electrode has such a construction that second conductivity type high impurity-concentration regions are evenly spaced in each of said second conductivity type regions.

* * * * *